United States Patent [19]
Lloyd et al.

[11] Patent Number: 5,331,552
[45] Date of Patent: Jul. 19, 1994

[54] METHOD AND APPARATUS FOR PROJECTING DIAGNOSTIC IMAGES FROM NON-ISOTROPIC VOLUMED DIAGNOSTIC DATA

[75] Inventors: Robert F. Lloyd, Muskego; Thomas E. Kennedy, Whitefish Bay; Christopher J. Wilbricht, Madison, all of Wis.

[73] Assignee: General Electric Company, Milwaukee, Wis.

[21] Appl. No.: 985,389

[22] Filed: Dec. 4, 1992

Related U.S. Application Data

[63] Continuation-in-part of Ser. No. 914,175, Jul. 14, 1992, Pat. No. 5,280,428, and a continuation-in-part of Ser. No. 925,544, Aug. 5, 1992, Pat. No. 5,295,488.

[51] Int. Cl.⁵ .............................................. G06F 15/00
[52] U.S. Cl. ........................... 364/413.15; 364/413.22
[58] Field of Search ..................... 364/413.15, 413.22, 364/413.09, 413.21; 128/708, 710, 712

[56] References Cited

U.S. PATENT DOCUMENTS 4,975,843  12/1990  Brunnett et al. ............... 364/413.14
5,170,347  12/1992  Tuy et al. ....................... 364/413.22

Primary Examiner—Roy N. Envall, Jr.
Assistant Examiner—Khai Tran
Attorney, Agent, or Firm—Quarles & Brady

[57] ABSTRACT

A computer program for manipulating diagnostic images obtained with computed tomography or magnetic resonance systems spatially compresses acquired non-isotropic data to isotropic coordinates as stored in computer memory. A view axis along which a projected image is to be displayed is adjusted to reflect this distortion. After projecting the voxel data to pixels of an image, the data is decompressed to remove any distortion. The decompression operates over the limited number of pixels rather than the entire set of voxels providing faster image generation.

12 Claims, 6 Drawing Sheets

FIG.5a 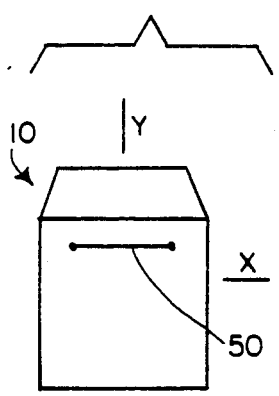 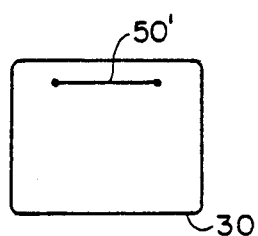
FIG.5b 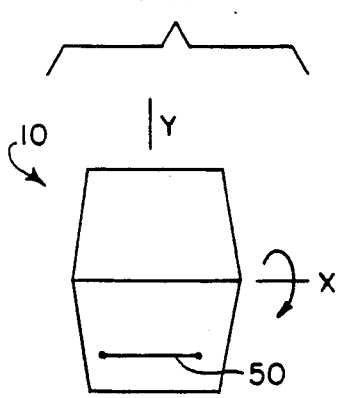 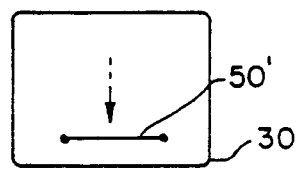
FIG.5c 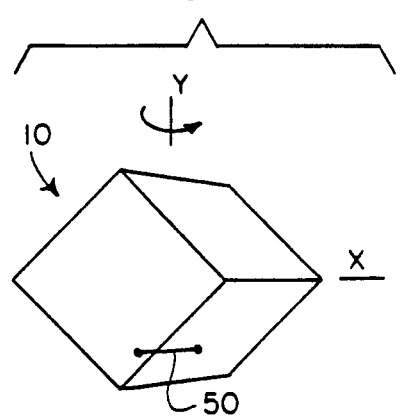 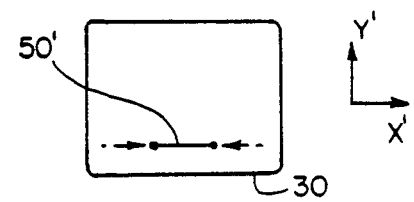
FIG.6

METHOD AND APPARATUS FOR PROJECTING DIAGNOSTIC IMAGES FROM NON-ISOTROPIC VOLUMED DIAGNOSTIC DATA

BACKGROUND OF THE INVENTION

This is a continuation-in-part of application Ser. No. 07/914175, filed Jul. 14, 1992, now U.S. Pat. No. 5,280,428, and entitled: "Method and Apparatus for Projecting Diagnostic Images From Volumed Diagnostic Data Accessed in Data Tubes" and of application Ser. No. 07/925,544, filed Aug. 5, 1992, now U.S. Pat. No. 5,295,488, entitled: "Method and Apparatus for Projecting Diagnostic Images from Volumed Diagnostic Data".

1. FIELD OF THE INVENTION

This invention relates to a method and apparatus for generating images from physiological data acquired at multiple points in a volume. In particular, the invention relates to a method which accommodates the physical constraints of conventional computer hardware and increases the speed with which diagnostic images may be transformed and displayed.

2. BACKGROUND ART

Advances in technology have provided the medical practitioner with a variety of medical imaging systems. One important class of medical imaging systems works by radiating energy through a region of interest in the body, either from an external source, such as x-rays or an RF field, or from an internal source such as an injected radioisotope. The interaction of the radiated energy with the body is measured at a variety of small volume elements ("voxels") within the body. The spatial coordinates of each of these voxels are identified and a map of the body within that region of interest is developed.

Two important types of medical imaging systems which provide such voxel data are Magnetic Resonance Imaging ("MRI") and X-ray Computed Tomography ("CT").

a. Magnetic Resonance Imaging

Any nucleus which possesses a magnetic moment attempts to align itself with the direction of the magnetic field in which it is located. In doing so, the nucleus precesses around this direction at a characteristic angular frequency (Larmor frequency) which is dependent on the strength of the magnetic field and on the properties of the specific nuclear species, i.e. the gyromagnetic constant $\gamma$ of the nucleus. This property of the nuclei causing the precession is termed spin—in an analogy to gyroscopic precession.

When a substance such as human tissue is subjected to a uniform magnetic field, the individual magnetic moments of the spins in the tissue precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another.

If the tissue is subjected to an oscillating radio frequency magnetic field which is in the x-y plane and which is near the Larmor frequency, the net aligned moment, $M_z$, may be rotated, or "tipped", into the x-y plane to produce a net transverse magnetic moment $M_t$, rotating in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field.

The practical value of this phenomenon resides in the signal which is emitted by the excited spins after the excitation signal is terminated. In simple systems, the excited spins induce an oscillating sine wave signal in a receiving coil. The frequency of this signal is the Larmor frequency, and its initial amplitude is determined by the magnitude of the transverse magnetic moment. The amplitude of the emission signal decays in an exponential fashion with time, t:

$$A = A_0 e^{-t/T^*_2} \quad (1)$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal in a perfectly homogeneous field.

Another important factor which contributes to the amplitude of the NMR signal is referred to as the spin-lattice relaxation process which is characterized by the time constant $T_1$. It describes the recovery of the net magnetic moment M to its equilibrium value along the axis of magnetic polarization (z) The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses of varying magnitude, duration, and direction. The prior art is replete with excitation techniques that are designed to take advantage of particular NMR phenomena and which overcome particular problems in the NMR measurement process.

When utilizing NMR to produce images it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x-, y- and z- axes. By controlling the strength of these gradients during each NMR cycle, the spatial distribution of spin excitation can be controlled and the location of the resulting NMR signals can be identified.

Typically, the volume which is to be imaged (region of interest) is scanned by a sequence of NMR measurement cycles. The resulting set of received NMR signals is digitized and processed to reconstruct data indicating the physical properties of specific voxels within the imaged volume. The voxel data is stored in an array in memory so that the spatial coordinates of each voxel may be identified.

b. Computed X-Ray Tomography

In a computed tomography system, an x-ray source is collimated to form a fan beam with a defined fan beam angle. The fan beam is oriented to lie within the x-y plane of a Cartesian coordinate system, termed the "gantry plane", and is transmitted through an imaged object, such as human tissue, to an x-ray detector array oriented within the gantry plane.

The detector array is comprised of a set of detector elements each of which measures the intensity of transmitted radiation along a different ray projected from the x-ray source to the particular detector element. The intensity of the transmitted radiation is dependent on the attenuation of the x-ray beam along that ray by the tissue.

The x-ray source and detector array are rotated on a gantry within the gantry plane and around a center of rotation within the tissue so that the angle at which the fan beam axis intersects the tissue may be changed. At each gantry angle, a projection is acquired comprised of the intensity signals from each detector element. The gantry is then rotated to a new angle and the process is repeated to collect a number of projections along a number of gantry angles to form a tomographic projection set.

The acquired tomographic projection sets are typically stored in numerical form for later computer processing to "reconstruct" a slice image according to reconstruction algorithms known in the art. The reconstruction process converts the data of the rays, which represents total attenuation along the lines of the rays, to voxel data which represents the incremental x-ray attenuation provided by a voxel within the scanned area.

A typical computed tomographic study involves the acquisition of a series of "slices" of the imaged tissue, each slice parallel to the gantry plane and having a slice thickness dictated by the width of the detector array, the size of the focal spot, the collimation and the geometry of the system. Each successive slice is displaced incrementally along a z-axis, perpendicular to the x and y axes, so as to provide a third spatial dimension of information. After reconstruction, voxel data over a volume of the patient is obtained.

c. The Display of Voxel Data

As noted above, each of these imaging systems employs energy radiated through a region of interest of the body and detects the interaction of the energy with the body to acquire data at a plurality of voxels. The type of radiated energy is different for different imaging systems. The radiated energy is x-rays in the case of computed tomography (CT) and a radio frequency magnetic field in the case of nuclear magnetic resonance imaging (MRI). The energy is sound waves in the case of ultrasound and high energy particles from an injected radioisotope in the case of nuclear medicine or PET scanning. In each case voxel data is obtained over a volume.

The processing and display of the voxel data produced by the above systems presents two problems. The first problem is simply the large amount of data that is acquired: a typical study may generate data for over 4,000,000 voxels. Efficient processing of this data is essential if the technology is to be practically useable.

The second problem is the need to present the voxel data in a meaningful way. The data is unintelligible when represented as numerals alone, so typically, each voxel value id projected to a brightness value of a picture element ("pixel") on an image plane. The pixels of the image plane together produce a picture-like image. The image is more easily understood by a human operator.

Projecting the voxels of the three dimensional volume to the pixels of a two dimensional picture requires discarding some voxel information. Ideally, however, an appropriately selected image plane will capture most of the diagnostically significant information. Alternatively, several image planes may be generated, and viewed sequentially. In this latter case, just as one may comprehend the three dimensions of a statue by viewing it from various angles, the multiple projections allow one to gain a more complete understanding of the voxel data.

In both cases, it is critical that the orientation of the image plane be freely selected, easily adjusted, and that new images be rapidly generated. This allows the ideal image plane to be determined on an interactive basis, or permits the quick shifting between different image planes necessary to visualize the three dimensions of the data. Ideally, the data should be capable of rotation and projection on a near "real-time" basis much as one might rotate a physical object within one's hands.

When the voxel data is isotropic, that is, when the voxel data samples the imaged object at points spaced equally along each of the axes of the Cartesian coordinate system, the rotation of the voxel data and its projection to an image is relatively straightforward. If the spacing of the pixels in the imaging plane, for example, is equal to the spacing of the voxel in the three dimensions of the imaged volume, then regardless of the rotation of the voxel data, one or more voxels will map to points near each pixel. Although there may be "gaps" in the rotated image where there is no clear mapping of voxels to pixels, such gaps will be isolated and hence easily identified and removed by interpolation.

Unfortunately, the voxel data typically is not isotropic, and in particular the spacing of the voxels along slices in the z-axis is normally larger than the intravoxel spacing within a slice along the x- and y-axes. When such non-isotropic voxel data is rotated to certain angles and projected to an image, multiple contiguous gaps will appear producing stripes or bands in the image. These contiguous gaps are difficult to identify and correct.

The gaps caused by non-isotropic voxel data can be prevented by interpolating the non-isotropic data into isotropic data, but the large number of voxels renders such interpolation extremely time-consuming and impractical.

SUMMARY OF THE INVENTION

The present invention provides a method of rotating and projecting non-isotropic voxel data to an image without time-consuming interpolation and without multiple contiguous gaps in the projected image. Generally, the invention compresses the non-isotropic data to isotropic data and adjusts the selection of the view axis (or rotation of the voxel data) to reflect this distortion. After projecting the voxel data to pixels, the data is decompressed to remove the distortion. The decompression may involve interpolation, but one which operates over the limited number of pixels rather than the entire set of voxels.

Specifically, in the present invention, the voxel data is stored in addresses in an electronic memory wherein the addresses are related to scaled spatial coordinates of the voxels. The scaled spatial coordinates are the actual spatial coordinates of the voxels transformed by multiplying at least one coordinate by a scaling factor.

A desired view axis is determined with respect to the actual spatial coordinates of the voxels along which to view the voxels, the desired viewing axis defined by three rotative coordinates. From this desired view axis and the scaling factor, an effective view axis is calculated, the effective view axis being such that a ray directed along the effective view axis intersects the same voxels at the scaled spatial coordinates, as the desired view axis would intersect the voxels at the actual spatial coordinates.

The scaled spatial coordinates of each voxel are then transformed by at least one rotation to produce rotated spatial coordinates so that the effective view axis is normal to an imaging plane. The voxels are projected along the effective view axis to pixels in the image plane having image coordinates corresponding to the rotated spatial coordinates. The pixel data is then displayed.

It is one object of the invention to provide for efficient transformation and projection of non-isotropic voxel data. Compressing the non-isotropic voxels data allows it to be simply manipulated. The decompression may be performed on the pixel image and thus requires relatively little computational effort.

It is another object of the invention to permit the above simplified transformation of non-isotropic voxel data while preserving the perception that isotropic data is being manipulated. Calculation of an effective view angle ensures that the image generated bears the same angular relationship to the view axis selected as would be obtained from the direct manipulation of isotropic voxel data.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 5(a)-(c) are perspective views of one row of voxels in an imaging volume and the projection of that row to the image plane after tilting and rotation only;

FIG. 6 is a flow chart of the steps of the present invention;

DETAILED DESCRIPTION OF THE PREFERRED EMBODIMENT

1. Medical Imaging Equipment a. Magnetic Resonance Imaging

Figure 1:
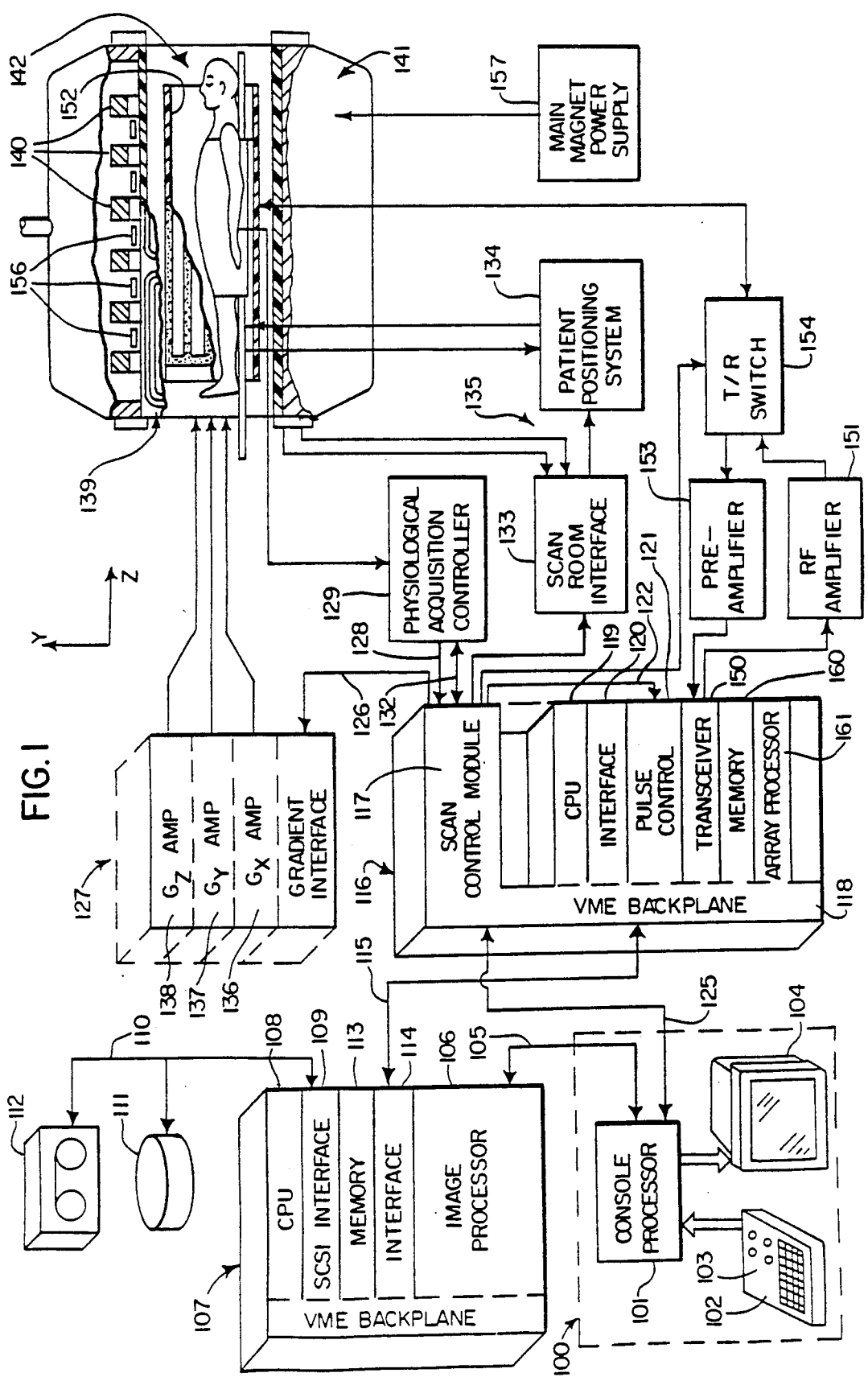
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103.

The computer system 107 is formed about a backplane bus which conforms with the VME standards, and it includes a number of modules which communicate with each other through this backplane. In addition to the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113 for storing voxel data arrays, and a serial interface module 114 that links the computer system 107 through a high speed serial link 115 to a system control 116.

The system control 116 includes a scan control module 117 which is incorporated as part of a backplane 118, and a series of modules which are connected together by the backplane 118. The backplane 118 conforms to the VME standards and it is controlled by a CPU module 119. A serial interface module 120 connects this backplane 118 to the high speed serial link 115, and a pulse control module 121 connects the backplane 118 to the scan control module 117 through a link 122. The scan control module 117 is also connected to the operator console 100 through a serial link 125, and it is through this link that the system control 116 receives commands from the operator which indicate the scan sequence that is to be performed.

The scan control module 117 operates the system components to carry out the desired scan sequence. It conveys data to the pulse control module 121 which indicates the timing, strength and shape of the RF pulses which are to be produced, and the timing of and length of the data acquisition. The scan control module 117 also connects through serial link 126 to a set of gradient amplifiers 127, and it conveys data thereto which indicates the timing and shape of the gradient pulses that are to be produced during the scan. The scan control module 117 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the scan control module 117 that synchronizes the scan with the patient's cardiac cycle or respiratory cycle. And finally, the scan control module 117 connects through a serial link 132 to a scan room interface circuit 133 which receives signals at inputs 135 from various sensors associated with the position and condition of the patient and the magnet system. It is through the scan room interface circuit 133 that a patient positioning system 134 receives con, hands which move the patient cradle and transport the patient to the desired position for the scan.

The gradient waveforms produced by the scan control module 117 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 155 is given by $B(x,y,z) = B_0 + G_x x + G_y y + G_z z$. The gradient magnetic fields are utilized to encode spatial information into the NMR signals emanating from the patient being studied.

Located within the bore 142 is a circular cylindrical whole-body RF coil 152. This coil 152 produces a transverse RF field in response to RF pulses provided by a transceiver module 150 in the system control cabinet 116. These pulses are amplified by an RF amplifier 151 and coupled to the RF coil 152 by a transmit/receive switch 154. Waveforms and control signals are provided by the pulse control module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the scan control module 117 to electrically connect the RF amplifier 151 to the coil 152 during the transmit mode and to connect the preamplifier 153 during the receive mode. The transmit/receive switch 154 also enables a separate RF coil (not shown) to be used in either the transmit or receive mode.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. In the case of a resistive magnet, a main power supply 157 is utilized to continuously energize the magnet 140 and in the case of a superconductive magnet, the main power supply 157 is utilized to bring the polarizing field produced by the magnet 140 to the proper operating strength and is then disconnected. In the case o#a permanent magnet, power supply 157 is not needed.

The received NMR signal is at or around the Larmor frequency, which in the preferred embodiment is around 63.86 MHz. This high frequency signal is demodulated in transceiver 150. The resulting demodulated NMR signal has a bandwidth of 125 kHz and it is centered at a frequency of 187.5 kHz. The demodulated NMR signal is digitized by an analog-to-digital (A/D) converter also in transceiver 150 and the output of the A/D converter is applied to a digital quadrature detector in the transceiver 150 which produces 16-bit in-phase (I) values and 16-bit quadrature (Q) values corresponding to the received digital signal. The resulting stream of digitized I and Q values of the received NMR signal is output through backplane 118 to the memory module 160 where it is employed to reconstruct an image according to reconstruction techniques known in the art.

The NMR signals picked up by the RF coil 152 are digitized by the transceiver module 150 and transferred to a memory module 160 which is also part of the system control 116. When the scan is completed and an entire array of data has been acquired in the memory module 160, an array processor 161 operates to Fourier transform the data into an array of voxel data. This voxel data is conveyed through the serial link 115 to the computer system 107 where it is stored in memory module 113. In response to commands received from the operator console 110, this voxel data may be stored for later use in the disk memory 111, or archived on the tape drive 112. It may be further processed by the image processor 106 and then conveyed to the operator console 100 and presented on the video display 104.

The voxel data is stored in memory module 113 at addresses related to the spatial coordinates of the voxel data. Hence, only the value of the voxel data need be explicitly stored, the spatial coordinates are implicit from the address of the imaged data in the memory of memory module 113.

b. Computed X-Ray Tomography

Figure 2:
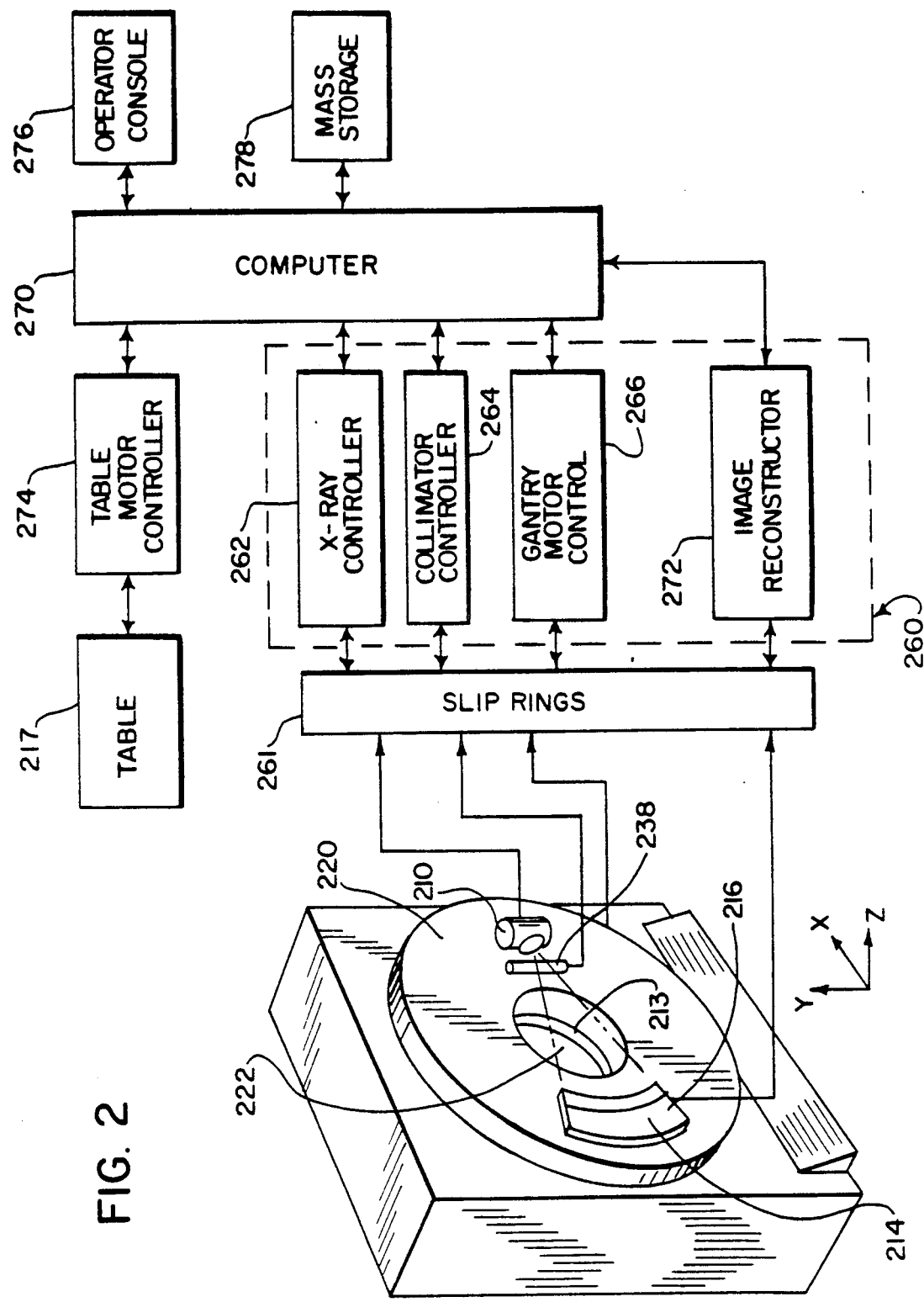
FIG. 2 is a schematic representation CT system as may be used with the present invention.

Referring to FIG. 2, a gantry 220, such as may be used in a "third generation" computed tomography (CT) scanner, includes an x-ray source 210 collimated by collimator 238 to project a fan beam of x-rays 222 through an imaged object (not shown) to detector array 214. The x-ray source 210 and detector array 214 rotate on the gantry 220 about a center of rotation 213. The rotation of the gantry 220 is within a gantry plane aligned with the x-y plane of a Cartesian coordinate system.

The patient rests on table 217 which is radio-translucent so as not to interfere with the imaging process. Table 217 may be controlled so that its upper surface translates along the z-axis perpendicular to the x-y imaging plane, moving the imaged object across the gantry plane.

The detector array 214 is comprised of a number of detector elements 216, organized within the gantry plane, which together detect the projected image produced by the attenuated transmission of x-rays through the patient.

The x-ray source 210 includes an anode (not shown) positioned within an evacuated glass envelope. A stream of electrons from a cathode (not shown) is accelerated against the face of the anode to produce the x-ray beam 222. The production of x-rays may be controlled by x-ray controller 262.

The control system of a CT scanner, suitable for use with the present invention, has gantry associated control modules 260 which include: x-ray controller 262 which provides power and timing signals to the x-ray source 210; collimator controller 264 which controls the positioning o#the collimator 238; gantry motor controller 266 which controls the rotational speed and position of the gantry 220; and the image reconstructor 272 which receives projection data from the detector array 214 and processes it to produce voxel data. The image reconstructor 272 may be an array processor such as is manufactured by Star Technologies of Virginia.

The gantry associated control modules 260 communicate with the x-ray tube 210, collimator 238 and detector 214 via slip rings 261. It will be recognized that direct cabling using a take up reel may be substituted for the slip rings 261 for a limited gantry rotation system.

The x-ray controller 262, the collimator controller 264 and the gantry motor 66 controller are connected to a computer 270. The computer 270 is a general purpose minicomputer and may be programmed to synchronize the rotation of the gantry 220 with the position of the fan beam 222.

The speed and position of table 217 along the z-axis is communicated to and controlled by computer 270 through table motor controller 274. The computer 270 receives commands and scanning parameters via operator console 276 which is generally a CRT display and keyboard which allows an operator to enter parameters for the scan and to display the reconstructed image and other information from the computer 270. A mass storage device 278 provides a means for storing operating programs for the CT imaging system, as well as voxel data for future reference by the operator.

2. Voxel and Pixel Data

The technologies of MRI imaging and CT imaging differ but they are similar in the respect that they both produce an array of voxel data of physical parameters at a large number of points over a volume within a patient. Importantly, each voxel is identifiable by spatial coordinates. MRI and CT imaging may be broadly classed, in this respect, with other medical imaging systems such as ultrasound and positron emission tomography ("PET") which ultimately produce similar voxel data. Co-pending U.S. patent application Ser. No. 07/867,597, entitled: "Ultrasound Imaging System with Improved Dynamic Focusing", filed Apr. 13, 1992, and co-pending U.S. patent application Ser. No. 07/904,791, filed Jun. 26, 1992 entitled: "Gamma serial No. Ray Detector For PET Scanner", describe such systems. Both cases are assigned to the assignee of the present invention and are hereby incorporated by reference.

Figure 3:
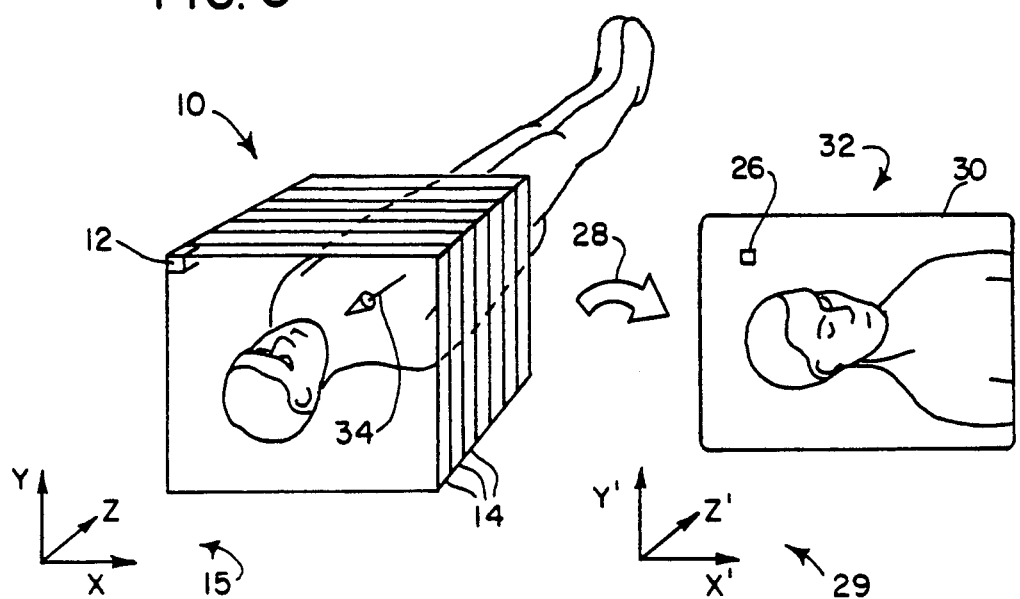
FIG. 3 is a pictorial representation of a volume of voxel data as acquired and as projected to an image plane.
Figure 4:
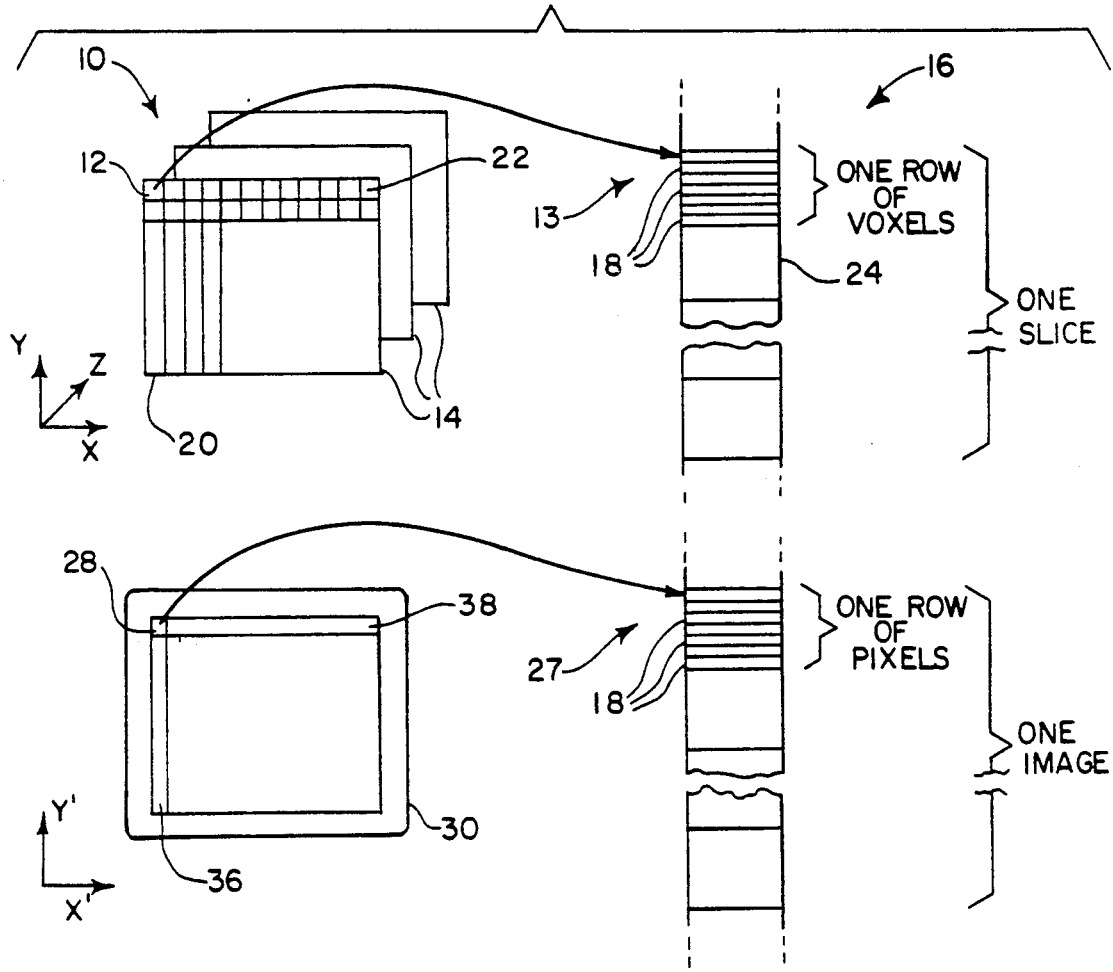
FIG. 4 is a schematic representation of the storage voxel and pixel data at sequential addresses in computer memory.

Referring now to FIGS. 3 and 4, voxel data 13 produced by such systems are collected over an imaged volume 10 encompassing a region of interest of the patient 11. Each voxel 12 encloses a portion of the imaged volume 10 and identifies the volume of tissue to which the voxel data 13 is related.

The voxel data 13 associated with each voxel 12 is linked to a spatial coordinate, which for simplicity, is the spatial coordinate of the center of its voxel 12. This spatial coordinate is described by three value measurements along the axes of a conventional Cartesian coordinate system. The orientation of the axes of the Cartesian coordinates is arbitrary, although ordinarily determined by the mechanics of the acquisition. The spatial coordinates of the voxels 12 and their corresponding voxel data 13 will be termed the spatial coordinates 15, and represented by the variables x, y, and z.

For simplicity, and in keeping with the orthogonality of axes of the Cartesian coordinate system, each voxel 12 is a simple rectangular prism, the size of each side ordinarily being defined by the limits of resolution of the imaging system. The voxels 12 fill the imaged volume 10 without gaps, in rectilinear columns 20 along the y-axis, and rows 22 along the x-axis, and slices 14 along the z-axis.

Figure 8A:
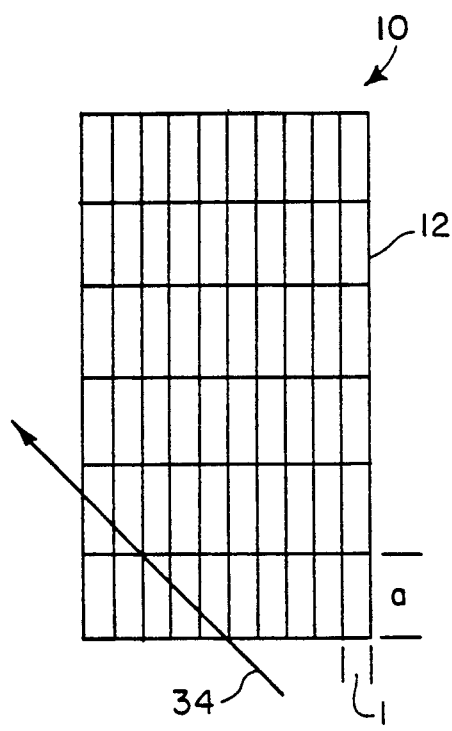
FIGS. 8(a) and 8(b) are schematic representations of the volume of voxel data of FIG. 3 as acquired in non-isotropic form and as stored in isotropic form and showing the effective and absolute view axis for the isotropic voxels.

Referring to FIG. 8(a), typically the spatial coordinates of the voxels 12 are not equally spaced along each axis of the Cartesian coordinate system, but rather the spacing along the z-axis, or between slices, is some value "a" times greater than the spacing along the x- and y-axes (between rows and columns). This spacing of the acquired voxel data 13 will be termed non-isotropic, to be distinguished from the case where the voxels 12 are equally spaced in row, column, and slice.

Referring now to FIG. 4, the voxel data 13 of each voxel 12 of each slice 14 is stored in memory 16, such as memory module 113 in the above described MRI system or memory associated with computer 270 of the above described CT machine. Memory 16 includes a plurality of words 18 each having a unique and sequentially numbered integer address.

The ability to project various images from the volume of voxel data acquired with the above described equipment requires that the spatial coordinates of each voxel datum 13 be preserved. Typically, the spatial coordinate information for each voxel datum 13 is preserved in the memory address of the voxel datum 13. The number of rows, columns, and slices of voxel data 13 along the x, y and z coordinates respectively are known and the voxel data is stored in a prearranged order. Accordingly, the spatial location of a particular voxel 12, associated with a voxel datum 13, may be deduced from the address of the voxel datum 13 in memory 16. Implicit in this storage order are the spatial coordinates of the voxels.

Accordingly, to simplify storing the spatial coordinates of the non-isotropic voxel data 13 in computer memory 16, which is addressed by sequential integer addresses, the units of the spatial coordinates of the voxel data 13, (x, y, z), are normalized to the dimensions of the corresponding spacing of the voxels 12 along each axis. After being normalized, the spatial coordinate of each voxel 12 changes by one, as one moves to the next voxel 12 along a given axis regardless of the actual physical space traversed. This normalization of the spatial coordinates of the voxel data 13, upon storage in memory 16, effectively compresses the imaging space 10 to an isotropic imaging space 10' (shown in FIG. 8(b)) so that the voxel data 13 in memory 16 is isotropic.

Each word 18 of memory 16 holds the voxel data 13 for one voxel 12. The voxels 12 are stored first by their order within a row 22, then according to their order in columns 20 and then according to their order in slices 14. The number of voxels in row 22 is fixed and known, as is the number of rows 22 and slices 14. Therefore, as noted above, the spatial coordinates of the voxel 12 may be deduced from the address of the voxel data 13 in computer memory 16, as well as a knowledge of the x, y and z physical spacing of the voxels, and vice versa.

As a result of this mapping of voxels 12 to addresses of memory 16, the voxel data 13 of one row 20 of voxels 12 will be held in sequential words 18 of memory 16. The voxel data 13 of voxels 12 for a next row 22', adjacent to row 22, will be stored in words 18 forming a block 24 of memory 16 contiguous (with respect to address) to the block storing the voxels 12 of row 22. Thus, to the extent possible, voxel data 13 for voxels 12 that are spatially proximate are stored in words 18 of memory 16 that are close in address.

Referring again to FIG. 3, in the present invention, the voxel data 13 associated with the imaged volume 10 will be converted to an image on a monitor 32. In this image, the voxel data 13 for selected voxels 12 are represented as a brightness or color of a picture element 26 ("pixel"). A pixel 26 will be typically the smallest unit of area in the image on the monitor 32 independently controllable in brightness or color. Pixels 26, in a manner analogous to voxels 12, are generally rectangular areas arranged contiguously over an image plane 30 of the image on monitor 32 in image coordinates 29 along rectilinear columns 36 along an axis x' and rows 38 along an image axis y'. A third axis z' runs normal to the image plane 30.

Referring again to FIG. 4, pixel data 27 indicating the brightness or color of each pixel is also stored in memory 6. As in the case with the voxels 12, the image coordinates of the pixels 26 may be deduced from the address of the particular word 18 to be used to store the pixel data 27. The data of the pixels 26 are stored first by their order within the row 38, then according to their order in columns 36. The number of pixels in a row 38 is fixed and known, as is the number of rows 38 and therefore, the image coordinates of the pixels 26 are easily calculated from the address of the pixel in computer memory 16, and vice versa. Also, as with the voxels, a result of this mapping of pixels 26 to addresses of memory 16, is that the pixel data 27 of one row 38 of pixels 26 will be held in sequential words 18 of memory 16. Thus, pixel data 27 for pixels 26 that are spatially proximate are stored in words 18 of memory 16 that are close in address.

3. Transformation of Voxel Data to Pixel Data

The imaged volume 10 is three-dimensional but the image on the monitor 32 is two-dimensional. For this reason, the voxel data 13 must be projected, as indicated by arrow 28 in FIG. 3, to "project" it to the two dimensions of the image. The process of projection 28 requires a selection of a projection axis 34 which corresponds to a line-of-sight of a hypothetical viewer viewing the imaged volume 10, and which is normal to the surface of the image plane 30. The projection axis 34 is selected to best exhibit the structure of interest in the patient 11 and will be parallel to the image axis z' when the image is displayed. After the projection axis 34 is selected, voxels 12 having the same x' and y' coordinates are combined, according to one or more projection techniques, to produce the pixel data 27, as will be described below.

When the projection axis 34 is changed in angular orientation, the image formed on the monitor 32 appears to rotate about one of the three axes x, y and z. Accordingly, the selection of the angular orientation of the projection axis 34 may be understood to be a process of rotating the voxel data 13 of the voxels 12 about one or more of the three perpendicular acquisition axes, x, y, or z. Rotation about the y-axis is termed "rotation", rotation about the x-axis is termed "tilt" and rotation about the z-axis will be termed "spin". Spin is also known as clockwise/counterclockwise in the art. Each of these rotations involves transforming the spatial coordinates of the voxel data 13 of a voxel 12 to new image coordinates. Such rotation of spatial coordinates of x, y and z to new image coordinates x', y' and z' may be simply represented by a matrix multiplication as follows:

$$V' = M_s M_r M_t V \quad (2)$$

where V' is the matrix of image coordinates $$\begin{bmatrix} x' \\ y' \\ z' \end{bmatrix}$$

and V is the matrix of spatial coordinates 15

$$\begin{bmatrix} x \\ y \\ z \end{bmatrix}$$

The matrices $M_s$, $M_r$, and $M_t$ (which effect the spin, rotation and the tilt respectively) are as follows:

$$M_s = \begin{bmatrix} \cos(s) & -\sin(s) & 0 \\ \sin(s) & \cos(s) & 0 \\ 0 & 0 & 1 \end{bmatrix} \quad (3)$$

where s is the spin angle $$M_r = \begin{bmatrix} \cos(r) & 0 & -\sin(r) \\ 0 & 1 & 0 \\ \sin(r) & 0 & \cos(r) \end{bmatrix} \quad (4)$$

where r is the rotation angle, and $$M_t = \begin{bmatrix} 1 & 0 & 0 \\ 0 & \cos(t) & \sin(t) \\ 0 & -\sin(t) & \cos(t) \end{bmatrix} \quad (5)$$

where t is the tilt angle.

Selecting a projection axis 34 by rotating the voxels 12 of the imaged volume 10 simply involves the matrix multiplication of the spatial coordinates of each voxel 12 by the product of the transformation matrices $M_s M_r M_t$. To reduce the number of calculations required, it is known to pre-multiply these three matrices $M_s M_r M_t$ together. The values of the angles s, r, and t do not change among voxels 12 and hence the product of $M_s M_r M_t$ is constant and need not be recomputed for each multiplication. In contrast, performing the matrix multiplications separately, that is multiplying the spatial coordinates of a voxel 12 first by $M_t$, and then by $M_r$, and then by $M_s$, although mathematically identical, triples the total computational effort and time required to perform the transformation.

Contrary to this reasoning, however, in the present invention, the application of the matrices $M_s M_r M_t$ is bifurcated, with the tilt and rotation matrices $M_r M_t$ being applied at one time, but the spin matrix $M_s$ being applied only after the projection of the voxel data 13 to pixel data 27 per the projection process 28. Each of these rotation matrices is independent, so they may be grouped together under the associative principal as desired. After multiplication by tilt and rotation matrices $M_r M_t$ but before multiplication spin matrix Ms, the rotated spatial coordinates 15 will be designated x'', y'' and z''.

Referring now to FIG. 6, in the present invention, first, voxel data 13 is acquired by means of an imaging system. This acquisition is depicted by first process block 39 and may involve the use of the MRI or CT systems as described above or other similar systems.

At process block 40, the spatial coordinates of the voxel data 13 are normalized, as described above, and the voxel data 13 stored in computer memory 16 at appropriate integer addresses. The normalization of the spatial coordinates of the voxels 12 effectively involves multiplying the z-axis coordinate of each voxel 12 by a scaling factor so that the z-axis increments between voxels 12, when scaled, are equal to the x and y axis increments between voxels 12. As noted, the addresses of voxel data 13 in memory 16 provide information as to the spatial coordinate of the voxel data 13.

At process block 41, a view axis 34 is selected by a human operator. The view axis 34 may be defined by three rotative coordinates, as described above, tilt, rotate, and spin, as represented by the angles t, r, and s respectively. Referring also to FIG. 8(a), and as described above, the view axis 34 corresponds to the line-of-sight of a hypothetical viewer viewing the imaged volume 10 prior to the normalizing compression of process block 40. With compression, shown in FIG. 8(b), the same view axis 34 will intersect different voxels 12 with the result being that the projected view, anticipated by the human operator, will be viewed from an unexpected angle, making interactive control of the rotation of the image difficult.

Accordingly, at process block 41, a new effective view axis 34' is determined. The effective view axis 34' is a function of the tilt and rotate angles t and r and the aspect ratio only; the spin will be performed, as will be described later, on an undistorted imaging volume 10.

Figure 8B:
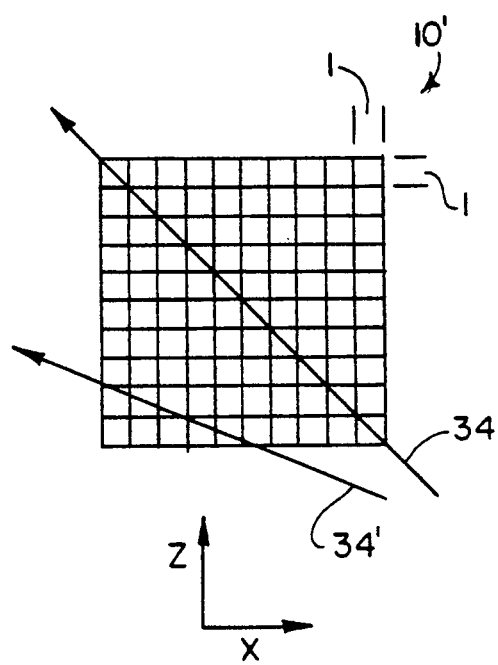

Referring to FIG. 8(b), the effective view angle 34' is chosen so that rays directed along the tilt and rotation angles of the effective view axis 34' on the isotropic imaging volume 10' intercept the same voxels 12 as rays directed along the effective tilt and rotation angles of view axis 34 intercept in the non-isotropic imaging volume 10.

The effective tilt and rotate angles $t_{eff}$ and $r_{eff}$ may be calculated as follows:

$$r_{eff} = \arcsin\left(\frac{\sin(r)}{\sqrt{\sin^2(r) + \cos^2(r)\sin^2(t) + \frac{\cos^2(r)\cos^2(t)}{a^2}}}\right) \quad (6)$$

$$t_{eff} = \arctan\left(a\frac{\sin(t)}{\cos(t)}\right) \quad (7)$$

where $r_{eff}$ is an angle of rotation of the effective axis,
$t_{eff}$ is an angle of tilt of the effective axis,
r is an angle of rotation of the view axis,
t is an angle of tilt of the view axis, and
1/a is the scaling factor used to compress the non-isotropic spatial coordinates along the z axis to isotropic coordinates.

At process block 42, the spatial coordinates of each voxel V are tilted and rotated only, by multiplying a matrix the spatial coordinates $$\begin{bmatrix} x \\ y \\ z \end{bmatrix}$$

by the matrix product of $M_r M_t$ where:

$$M_r M_t = \begin{bmatrix} \cos(r_{eff}) & \sin(r_{eff})\sin(t_{eff}) & -\sin(r_{eff})\cos(t_{eff}) \\ 0 & \cos(t_{eff}) & \sin(t_{eff}) \\ \sin(r_{eff}) & -\cos(r_{eff})\sin(t_{eff}) & \cos(r_{eff})\cos(t_{eff}) \end{bmatrix} \quad (8)$$

Also at process block 42, but after the tilting and rotation, the voxel data 13 of voxels 12 are compressed on a row by row basis, along the z axis, according to techniques discussed in detail below, to produce pixels 26 having image coordinates x' and y'.

At process block 46, the coordinates of these pixels 26 are rotated about the z axis by multiplication of their coordinates by the matrix $M_s$. These rotated pixels 26 are then displayed at process block 48.

The purpose of the bifurcation of the rotation process, employing matrices $M_r M_t$ before the compression of process block 42 and matrix $M_s$ after the compression of process block 42, is illustrated in FIGS. 5(a) through 5(c). The original, non-rotated imaged volume 10 includes a representative row 22 aligned with the x-axis. Prior to tilting, this row 22 projects to a row 38 in the imaging plane 30 aligned with the x'-axis. As shown in FIG. 5(b), after tilting about the x-axis, row 22 is displaced along the y'- and z'-axis without rotation of row 38 in the imaging plane 30. Similarly, and referring to FIG. 5(c), with rotation of the imaged volume 10 about the y-axis, the representative row 22, as projected to row 38 in the imaging plane 30, becomes shorter but still does not rotate within the imaging plane 30.

This will be true for any arbitrary row of voxels 22 within the imaged volume 10 as may be better understood by referring to the product of matrices $M_r M_t$ (shown in equation (8) above) which represent the tilting and rotation only of the coordinates of the imaged volume 10. Matrix sub-element column 2, row 1 is zero. As a result, changes in x (as one traverses a row 22) do not affect the ultimate value of the y" coordinate obtained by multiplying the spatial coordinates 15 by the matrix (8). Simply put, a row of data 22 in the original imaged volume 10 maps to a row of data 38 in the imaging plane 30. This results in: (1) faster reading from and writing to the memory 16 for reading voxel data 13 and for storing pixel data 27 and (2) improved the efficiency of the tilting and rotate transformations by allowing reuse of calculations made for adjacent voxels. Both of these improvements were described in detail above.

Figure 7:
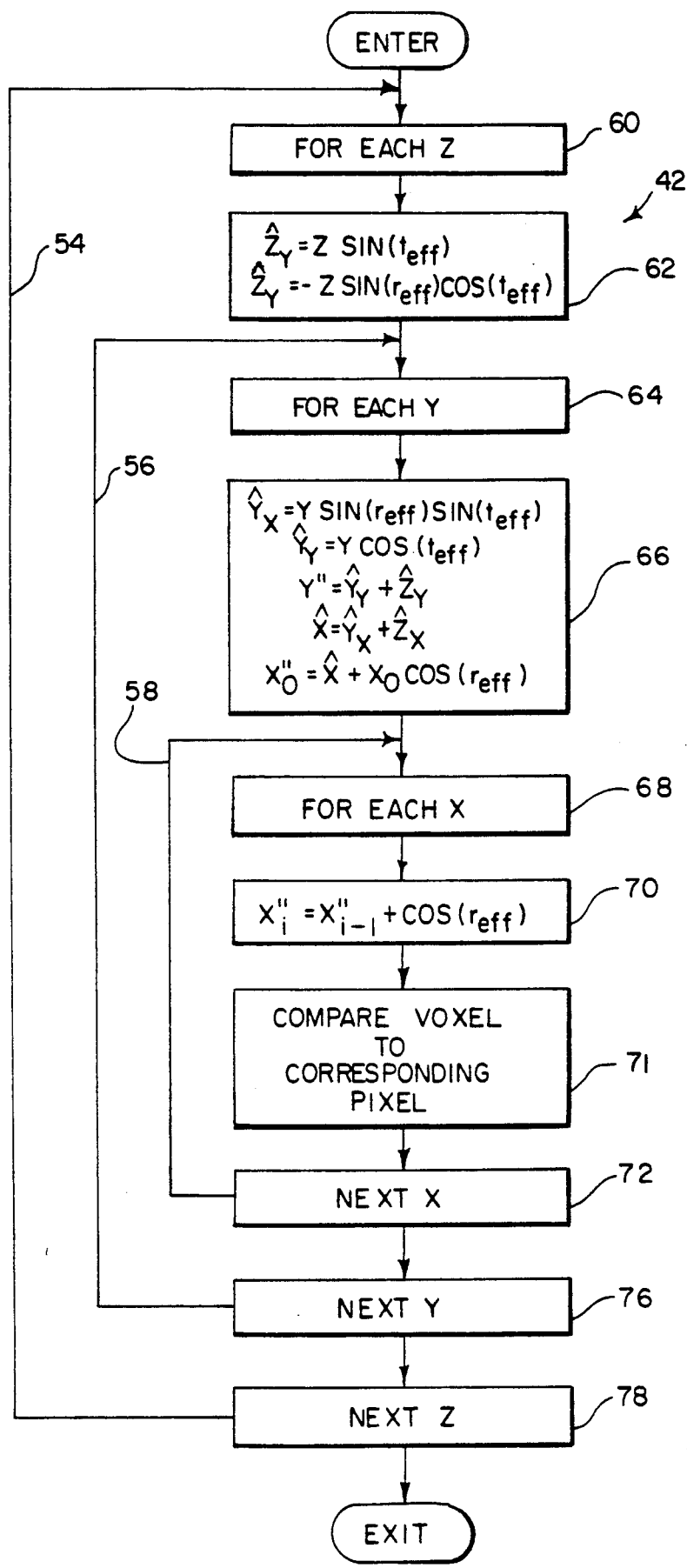
FIG. 7 is a detailed flow chart of the fourth step of FIG. 6.

The tilt/rotate step of process block 42 of FIG. 6 is shown in FIG. 7 and comprises a series of loops identified by paths 54, 56 and 58. These loops step sequentially through the voxel data 13 by memory address and hence by spatial coordinate because of the correlation of address and spatial coordinate. The loops 54, 56, 58 read each voxel by its slice 14, then by column 20 and then by row 22, respectively.

For each z value of the spatial coordinate, per process block 60 and loop 54, and hence for each slice 14, shared values $z_x$ and $z_y$ are computed as indicated by process block 62 and equations (9) and (10) below.

$$\hat{z}_x = -z \sin(r_{eff})\cos(t_{eff}) \quad (9)$$

$$\hat{z}_y = z \sin(t_{eff}) \quad (10)$$

These values $z_x$ and $z_y$ need only be computed once for each slice 14.

Next, and within loop 54, at process block 64, the loop begins and a first y value of the spatial coordinate is selected to identify a row 22 within the slice selected at process block 60. For each such row 22 selected at process block 64 for loop 56, shared values $y_x$ and $y_y$ are calculated at process 66 as follows:

$$\hat{y}_x = y \sin(r_{eff})\sin(t_{eff}) \quad (11)$$

$$\hat{y}_y = y \cos(t_{eff}) \quad (12)$$

In addition, the rotated coordinate y" for each voxel in the row selected by the value of y may be pre-computed according to the following equation being a portion of the matrix multiplication of the coordinates of the voxels times the matrix of equation (8) above:

$$y'' = \hat{y}_y + \hat{z}_y \quad (13)$$

Further, a portion of the calculation of x" described below may be precomputed as follows:

$$\hat{x} = \hat{y}_x + \hat{z}_x \quad (14)$$

and $$x''_0 = \hat{x} + x_0 \cos(r_{eff}) \quad (15)$$

where $x_0$ is the first value of x in a row 22.

Next, and within the loops 54 and 56, at process block 68, loop 58 is entered. Within this loop 58, an x value or column 20 is selected. At this point a particular voxel 12 has been identified by its complete spatial coordinate. At process block 70, the rotated coordinate x" of each voxel 12 in the row 22 and slice 14 selected in loops 56 and 54 is determined according to the following equation (16) which is a portion of the matrix multiplication of the coordinates the voxels 12 times the matrix of equation (8) above:

$$x''_i = \hat{x} + x_i \cos(r_{eff}) \quad (16)$$

A value for z" could be computed but is not required in the preferred embodiment as will be explained below. Omission of the calculation of z" further simplifies the translation of the voxel coordinates.

It will be understood, in referring to equations (16) of process block 70, that only a single multiplication is required: $x \cos(r_{eff})$ and of that the term: $\cos(r_{eff})$ may be pre-computed and stored. Thus, the most often repeated block of the loops of FIG. 7, that is, the calculation of process block 70, may be computed extremely rapidly on conventional computer systems. Further, because the $x_i$ increment between voxels in a row is one, the quantity $x_i\cos(r)$ for a given voxel at $x_i$ may be obtained simply by adding the constant $\cos(r)$ to the quantity $x_{i-1}\cos(r)$ as calculated at the previous voxel at $x_{i-1}$. The most often repeated calculation in the loops 54, 56, and 58 is then simply the addition of a constant $\cos(r)$ according to the following equation (14'):

$$x''_i = x''_{i-1} + \cos(r) \quad (17)$$

This speed gain is intimately linked to the bifurcation of the tilt/rotate step 42 and a spin step 46. If tilt, rotate and spin were to be performed at one time, the value y" (in fact y') could not be pre-computed at process block 66 but would have to be repeated at much greater frequency at process block 70. This is because it would be dependant on the y axis coordinate value, not selected until process block 68. Additional savings in calculation time is obtained by the ability to discard z" information which results from the compression scheme of block 42 which will be described below.

At process block 71, after the calculation of each value of x" and y" for each voxel 12, the values of each voxel is compared to a corresponding pixels 26 at pixel coordinate x' equal to x" and y' equal to y" to effect the compression of process block 42 as described below.

The loops of 54, 56 and 58 are closed by process blocks 72 through 76 respectively. Process block 72 increments the value of x until an entire row 22 of voxels 26 have been scanned and then allows the program to proceed to process block 76 for the next value of y or the next row 22. When each of the x and y values has been incremented for a slice 14, process block 76 allows the program to proceed to process block 78 where the next slice 14 or z value is selected and loops 56 and 58 are repeated for that slice. When each of the voxels of the slices 14 has been rotated, the entire imaged volume 10 has been transformed and the program exits.

A second speed advantage attendant to the bifurcation of the tilt/rotate step 42 (of FIG. 6) from the spin step 46, results from the fact that a row of voxels 12 projects to a row of pixels 26 (as described above with respect to FIG. 5(a) through 5(b)) and that the data of both pixels 26 and voxels 12 is stored so that rows of data are at proximate addresses in memory. The ability to read and to write to a single row either in the imaged volume 10 or the display plane 30 allows utilization of memory caching systems where blocks of contiguous memory are moved from slow storage devices such as on-board dynamic random access memory ("DRAM") to fast storage devices such as on-chip cache memory. The speed advantages of such systems rely on the processing of information at adjacent addresses as provided by the present invention as opposed to systems where the associated voxels and pixel data 27 might be stored at non-consecutive addresses. Caching schemes, which implicitly attempt to predict the next memory to be used, are more successful when memory is read or written to at consecutive addresses.

Referring again to FIG. 6, at process block 42, the voxel data 13 of voxels 12, as tilted and rotated, are also compressed along the z-axis to produce pixels 26 having image coordinates x" and y". This compression may be done after the tilting and rotation of each row of data. Compression of arrays of voxel data 13 is known in the art and requires selecting among the voxels 12 along a particular ray aligned with the effective projection axis 34'. In the preferred embodiment, the compression method is chosen from those indifferent to the z" coordinate of the transformed spatial coordinates (x", y" and z') of the voxels 12, thus allowing the elimination of calculation of z" in process block 70 of FIG. 7.

A number of compression systems meet this requirement including that of finding the minimum or maximum voxel value for a given x' and y' image coordinate or computing a sun, marion of all voxel values for a given value of x' and y'. The compression in process block 42 is performed by comparing the tilted and rotated voxel data 13 of each row to the value of a pixel with corresponding values of x' and y'. When the maximum value of voxel data 13 is sought for a given value of x' and y', the memory 16 for pixels 26 is initially loaded with a value lower than any possible value of voxel data 13. Each transformed voxel datum is then compared to the corresponding pixel datum in memory 16. If the voxel datum is greater than the pixel datum, that voxel datum replaces the pixel datum. Once all voxel data 13 for all rows has been transformed and compared to the pixel values, the value at each pixel 26 will represent the highest valued voxel data 13 along the given z' axis.

The spatial coordinates of the voxels 12 as rotated and compressed per process block 42 will not necessarily be integer values. For example, a voxel having spatial coordinates 1, 2 and 4 may rotate to a voxel having spatial coordinates 1.2, 3.6 and 5.2 and project to a pixel having spatial coordinates 1.2, 3.6. Accordingly the transformed coordinates may be truncated to integer values corresponding to possible integer addresses. Alternatively, new values of voxel or pixel data 27 may be interpolated at integer coordinates between the transformed coordinates. This latter procedure is not adopted in the preferred embodiment as it requires preservation of z" information (the importance of which is discussed below) and the allocation of additional memory to store rotated voxels prior to interpolation. This truncation during compression is possible without causing multiple contiguous gaps in the pixels because the voxel data has been compressed to isotropic form equal in spacing to the pixel spacing.

At process block 46, the coordinates of these pixels 26 are (1) decompressed to non-isotropic dimensions by a decompression matrix $M_d$, which simply rescales the image coordinates of the pixels 26 along an appropriately transformed axis, and (2) spins the pixels 26 about the z-axis by multiplication of their coordinates by the matrix $M_s$. These operations are preferably performed at one time using a precomputed matrix which is the product $M_s M_d$ where $M_d$ is:

$$M_d = \begin{bmatrix} m_{11} m_{12} \\ m_{21} m_{22} \end{bmatrix} \qquad (18)$$

where:

$$m_{11} = \sqrt{\frac{\sin^2(t) + \frac{\cos^2(t)}{a^2}}{\sin^2(r) + \cos^2(r)\sin^2(t) + \cos^2(r)\frac{\cos^2(t)}{a^2}}} \qquad (19)$$

which for $\cos(r) \neq 0$ becomes $\frac{\cos(r_{eff})}{\cos(r)}$ (20)

$$m_{12} = \sin(r_{eff})\sin(t_{eff})\cos(t)\left(1 - \frac{1}{a^2}\right) \qquad (21)$$

$$m_{21} = 0 \qquad (22)$$

and $$m_{22} = \begin{cases} \frac{1}{a} & \text{for } \cos(t) = 0 \\ \frac{\cos(t_{eff})}{\cos(t)} & \text{otherwise} \end{cases} \qquad (23)$$

Because the pixels are decompressed prior to spinning, no effective spin angle need be calculated but the absolute spin angle may be used. Typically, the rotated and decompressed pixels 26 will be interpolated to the regular image coordinates of the image plane 30. This interpolation, taking place over only the number of pixels 26 rather than the number of voxels 12, is relatively rapid.

Referring again to FIG. 6, at process block 48, a brightness or color value is assigned to the value of each of the pixels 26 for display on the display 32.

Many modifications and variations of the preferred embodiment which will still be within the spirit and scope of the invention will be apparent to those of ordinary skill in the art. In order to apprise the public of the various embodiments that may fall within the scope of the invention, the following claims are made.

I claim:

1. A method of generating a diagnostic image of a body comprising the steps of:
   directing a radiated energy through a region of interest of the body;
   detecting an interaction of the energy with the body to acquire data at a plurality of voxels, the voxels having actual spatial coordinates in dimensions of a coordinate system and being located within the region of interest of the body wherein a value of the datum of each voxel corresponds to a physical property of the body at the spatial coordinates, wherein the spatial coordinates of the voxels are not equally spaced along each of the dimensions;
   storing the data of the voxels in addresses in an electronic memory wherein the addresses are related to scaled spatial coordinates of the voxels, the scaled spatial coordinates being the actual spatial coordinates of the voxels transformed by multiplying at least one coordinate by a scaling factor;
   determining a desired view axis with respect to the actual spatial coordinates of the voxels along which to view the voxels, the desired view axis defined by three rotative coordinates;
   calculating an effective view axis from the desired view axis and the scaling factor, so that a ray directed along the effective view axis intersects the same voxels at the scaled spatial coordinates as the desired view axis would intersect the voxels at the actual spatial coordinates;
   transforming the scaled spatial coordinates of each voxel by at least one rotation to produce rotated spatial coordinates so that the effective view axis is normal to an imaging plane;
   projecting the voxels along the view axis to pixels in the image plane having image coordinates corresponding to the rotates spatial coordinates; and
   displaying pixel data at the image coordinates in an image.

2. The method of claim 1 including the additional step of rescaling the pixels of the image plane after the projecting step so that the image coordinates of the pixels correspond to the actual spatial coordinates of the voxels.

3. The method of claim 2 wherein the step of rescaling also rotates the pixels about the view axis.

4. The method of claim 1 wherein the data of the voxels x-ray attenuation data produced in a three-dimensional field by a computed tomography scanner.

5. The method of claim 1 wherein the data of the voxels is nuclear magnetic resonance data produced in a three-dimensional field by magnetic resonance imaging equipment.

6. The method of claim 1 wherein the effective view axis is calculated by:

$$r_{eff} = \arcsin\left(\frac{\sin(r)}{\sqrt{\sin^2(r) + \cos^2(r)\sin^2(t) + \frac{\cos^2(r)\cos^2(t)}{a^2}}}\right)$$

$$t_{eff} = \arctan\left(a\frac{\sin(t)}{\cos(t)}\right)$$

where $r_{eff}$ is an angle of rotation of the effective axis,
$t_{eff}$ is an angle of tilt of the effective axis,
r is an angle of rotation of the view axis,
t is an angle of tilt of the view axis, and
1/a is the scaling factor.

7. The method of claim 2 where the rescaling is accomplished by multiplying each image coordinate x' and y' of a pixel by the matrix $M_d$ where:

$$M_d = \begin{bmatrix} \frac{\cos(r_{eff})}{\cos(r)} & \sin(r_{eff})\sin(t_{eff})\cos(t)\left(1 - \frac{1}{a^2}\right) \\ 0 & \frac{\cos(t_{eff})}{\cos(t)} \end{bmatrix}$$

where:

$$r_{eff} = \arcsin\left(\frac{\sin(r)}{\sqrt{\sin(r^2) + \cos(r^2)\sin(t^2) + \frac{\cos(r^2)\cos(t^2)}{a^2}}}\right)$$

$$t_{eff} = \arctan\left(a\frac{\sin(t)}{\cos(t)}\right)$$

where $r_{eff}$ is an angle of rotation of the effective axis,
$t_{eff}$ is an angle of tilt of the effective axis,
r is an angle of rotation of the view axis,
t is an angle of tilt of the view axis, and
1/a is the scaling factor.

8. An apparatus generating a diagnostic image of a body comprising:

a means for directing a radiated energy through a region of interest of the body;
a means for detecting an interaction of the energy with the body to acquire data at a plurality of voxels, the voxels having spatial coordinates located within the region of interest of the body wherein a value of the datum of each voxel corresponds to a physical property of the body at the spatial coordinates, wherein the voxels are not equally spaced along each of the dimension;
an electronic memory means for storing the data of the voxels in addresses wherein the addresses are related to scaled spatial coordinates of the voxels, the scaled spatial coordinates being the actual spatial coordinates of the voxels transformed by multiplying at least one coordinate by a scaling factor;
a means for determining a desired view axis with respect to the actual spatial coordinates of the voxels along which to view the voxels to an image plane, the desired axis defined by three rotative coordinates;
a means for calculating an effective view axis from the desired view axis and the scaling factor, so that a ray directed along the effective view axis intersects the same voxels at the scaled spatial coordinates as the desired view axis would intersect the voxels at the actual spatial coordinates;
a means for transforming the scaled spatial coordinates of each voxel by at least one rotation to produce rotated spatial coordinates so that the effective view axis is normal to an image plane;
a means for projecting the voxels along the view axis to pixels in the image plane having image coordinates corresponding to the rotated spatial coordinates; and
a means for displaying pixel data at the image coordinates in an image.

9. The apparatus of claim 8 wherein the means for transforming the scaled spatial coordinates includes means for rescaling the pixels of the image plane after projecting by the projecting mans so that the image coordinates of the pixels correspond to the axis spatial coordinates of the voxels.

10. The apparatus of claim 9 wherein the means for rescaling also rotates the pixels about the view axis.

11. The apparatus of claim 8 wherein the directing means is an x-ray tube and wherein the detecting means is an array of x-ray detectors to provide voxel data related to the attenuation of the x-rays by the body.

12. The apparatus of claim 8 wherein the directing means is an RF coil for transmitting RF energy and the detecting means is an RF antenna for receiving NMR signals to provide voxel data related to the precessing of protons caused by the RF energy.

* * * * *

UNITED STATES PATENT AND TRADEMARK OFFICE
CERTIFICATE OF CORRECTION

PATENT NO. : 5,331,552

DATED : July 19, 1994

INVENTOR(S) : Robert F. Lloyd et al.

It is certified that error appears in the above-identified patent and that said Letters Patent is hereby corrected as shown below:

| | |
|---|---|
| Col. 4, line 2 | "voxel value id projected" should be --voxel value is projected--. |
| Col. 7, lines 1,2 | "con, hands" should be --commands--. |
| Col. 7, lines 39,40 | "transmit/-receive" should be --transmit/receive--. |
| Col. 7, line 60 | "case o# a" should be --case of a--. |
| Col. 8, line 66 | "o# the" should be --of the--. |
| Col. 9, line 42 | "Gamma serial No. Ray" should be --Gamma Ray--. |
| Col. 11, line 14,15 | "memory 6." should be --memory 16--. |
| Col. 13, line 68 | "matrix the spatial" should be --matrix of the spatial--. |
| Col. 14, line 67 | "values $z_x$ and $z_y$" should be --values $\hat{z}_x$ and $\hat{z}_y$--. |
| Col. 15, line 6 | "values $z_x$ and $z_y$" should be --values $\hat{z}_x$ and $\hat{z}_y$--. |
| Col. 15, line 9 | "loop begins" should be --loop 56 begins--. |

UNITED STATES PATENT AND TRADEMARK OFFICE
CERTIFICATE OF CORRECTION

PATENT NO. : 5,331,552
DATED : July 19, 1994
INVENTOR(S) : Robert F. Lloyd et al.

It is certified that error appears in the above-identified patent and that said Letters Patent is hereby corrected as shown below:

Col. 15, line 12     "$y_x$ and $y_y$" should be --$\hat{y}_x$ and $\hat{y}_y$--.

Col. 15, line 44     "coordinates the voxels" should be --coordinates of the voxels--.

Col. 15, line 60     "the xi increment" should be --the x increment--

Col. 16, line 67     "sun, marion" should be --summation--.

Claim 8
Col. 20, line 20     "desired axis" should be --desired view axis--.

Claim 9
Col. 20, line 41     "projecting mans" should be --projecting means--.

Signed and Sealed this

Twenty-fifth Day of October, 1994

*Attest:*

BRUCE LEHMAN

*Attesting Officer*     *Commissioner of Patents and Trademarks*